US006398476B1

(12) United States Patent
Ando

(10) Patent No.: US 6,398,476 B1
(45) Date of Patent: *Jun. 4, 2002

(54) AUTOMATIC STORAGE UNIT AND AUTOMATIC STORING METHOD

(75) Inventor: Keiichi Ando, Yamagata (JP)

(73) Assignee: NEC Corporation (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/013,562

(22) Filed: Jan. 26, 1998

(30) Foreign Application Priority Data

Jan. 24, 1997 (JP) .............................. 9-011078

(51) Int. Cl.⁷ .............................. B65G 49/07
(52) U.S. Cl. ...................... 414/282; 414/273; 414/277; 414/807; 414/940
(58) Field of Search ................. 414/273, 277, 414/280–283, 411, 222, 225, 226, 807, 811, 940

(56) References Cited

U.S. PATENT DOCUMENTS

| | | | | |
|---|---|---|---|---|
| 4,964,776 A | * | 10/1990 | Wakita et al. | 414/940 X |
| 5,163,802 A | * | 11/1992 | Poinelli | 414/940 X |
| 5,303,482 A | | 4/1994 | Yamashita et al. | 34/80 |
| 5,363,867 A | * | 11/1994 | Kawano et al. | 414/940 X |
| 5,431,600 A | * | 7/1995 | Murata et al. | 414/940 X |
| 5,443,346 A | * | 8/1995 | Murata et al. | 414/940 X |
| 5,628,604 A | * | 5/1997 | Murata et al. | 414/940 X |
| 5,746,008 A | * | 5/1998 | Yamashita et al. | 34/211 |

FOREIGN PATENT DOCUMENTS

| | | | | |
|---|---|---|---|---|
| JP | 60 36205 | | 2/1985 | |
| JP | 61 75194 | | 5/1986 | |
| JP | 62121106 | | 6/1987 | |
| JP | 1-132131 | * | 5/1989 | ................. 414/940 |
| JP | 6-16206 | | 1/1994 | |
| JP | 6-156614 | | 6/1994 | |
| JP | 7-53010 | | 2/1995 | |
| JP | 7-106406 | | 4/1995 | |

* cited by examiner

Primary Examiner—Steven A. Bratlie
(74) Attorney, Agent, or Firm—Dickstein Shapiro Morin & Oshinsky LLP

(57) ABSTRACT

In an automatic storage system and an automatic storing method for automatically take in and out a container box 1 accommodating therein a wafer carrier 6, a take-in port and a take-out port of a storage unit 8 are unified to one common inlet/outlet port 15, and a control is conducted to the effect that when the container box 1 is taken in and out on the basis of a take-in/take-out schedule of the container box 1 to the storage unit 8, the empty container box is ceaselessly left at the inlet/outlet port 15. Thus, the take-in/take-out operation can be smoothly conducted with no necessity of enlarging the storage unit 8 and with no congestion of the conveying container box accommodating therein the wafer carrier 6.

8 Claims, 6 Drawing Sheets

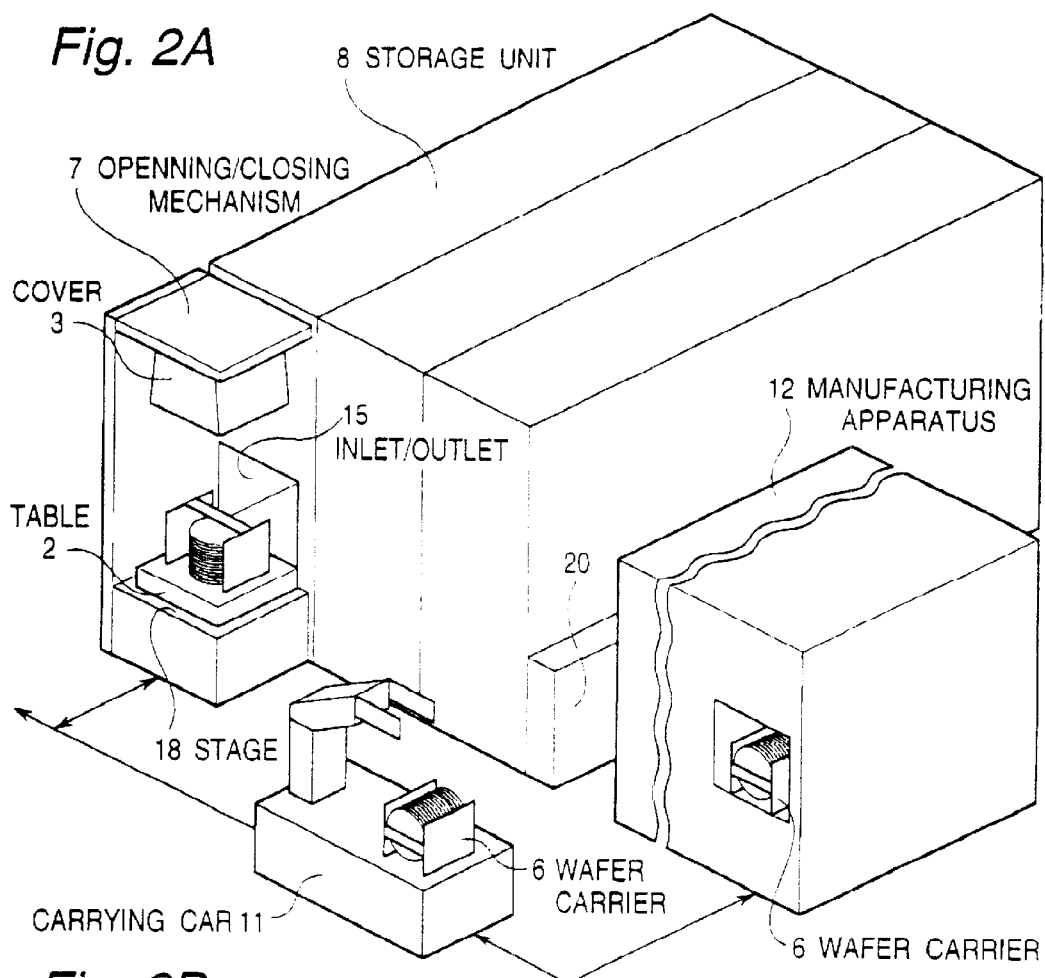
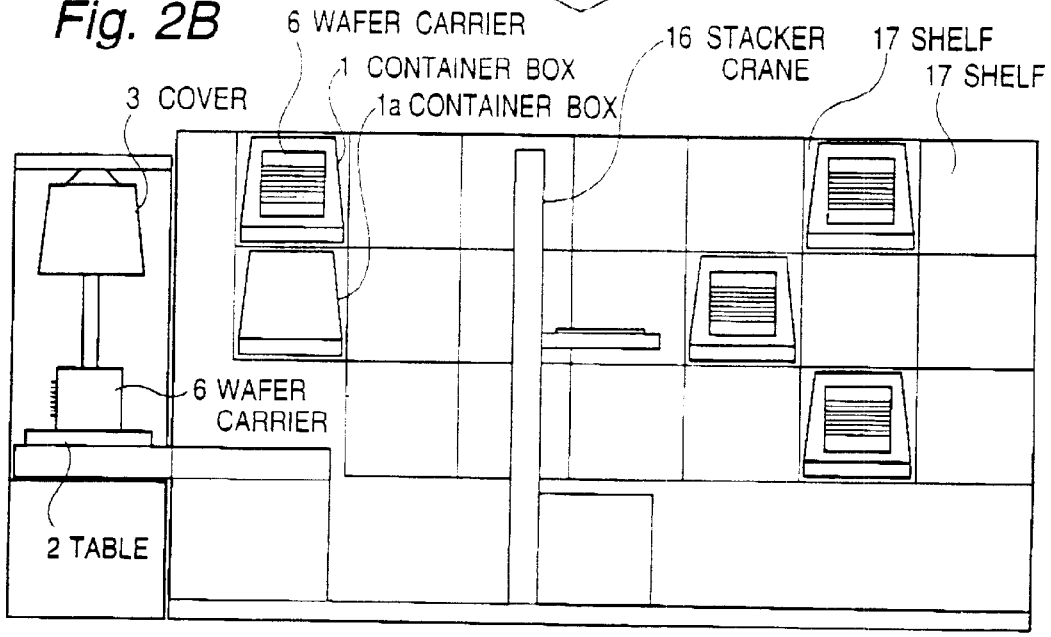

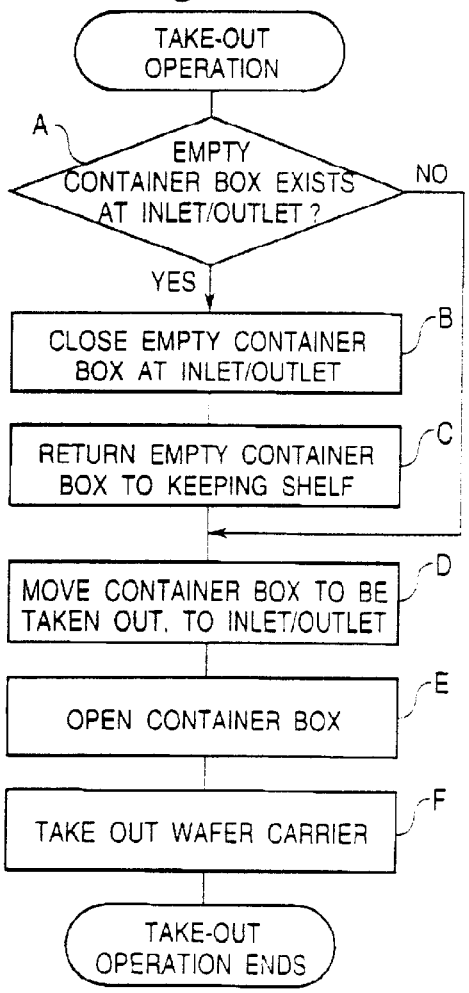

Fig. 3A

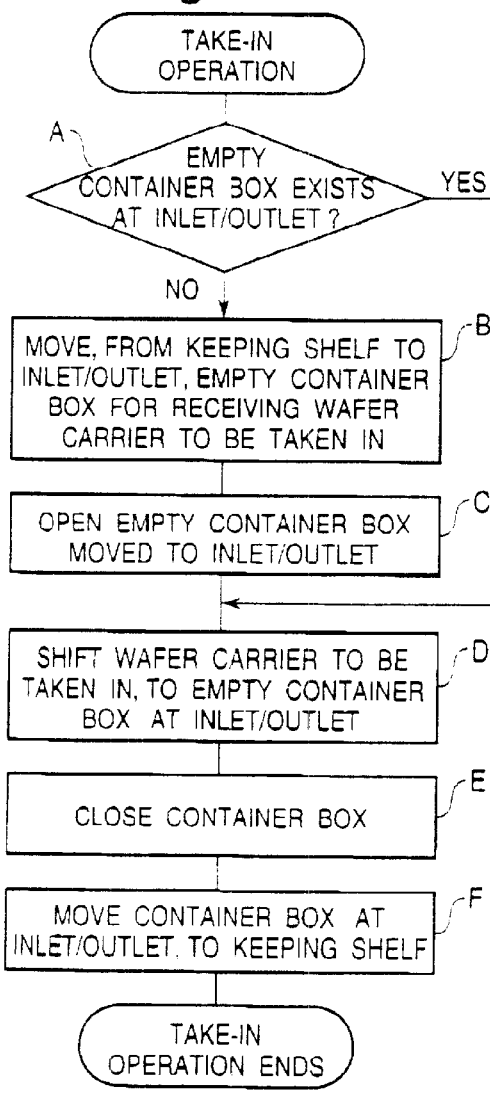

| REG. NO. | OPERATION | CARRYING SOURCE | CARRYING DESTINATION |
|---|---|---|---|
| 1 | TAKE-OUT | AUTOMATIC STORAGE UNIT | MANUFACTURING APPARATUS 1 |
| 2 | TAKE-OUT | AUTOMATIC STORAGE UNIT | MANUFACTURING APPARATUS 2 |
| 3 | TAKE-IN | MANUFACTURING APPARATUS 3 | AUTOMATIC STORAGE UNIT |
| 4 | TAKE-IN | MANUFACTURING APPARATUS 4 | AUTOMATIC STORAGE UNIT |
| 5 | TAKE-IN | MANUFACTURING APPARATUS 5 | AUTOMATIC STORAGE UNIT |
| 6 | TAKE-OUT | AUTOMATIC STORAGE UNIT | MANUFACTURING APPARATUS 6 |

AUTOMATIC STORAGE UNIT AND AUTOMATIC STORING METHOD

BACKGROUND OF THE INVENTION

1. Field of the Invention

The present invention relates to an automatic storage system and an automatic storing method in which a carrier for holding a plurality of plate-like works, such as wafers processed in a semiconductor device manufacturing process and reticles for an exposure machine, is accommodated into a container box, and the container box is taken into and taken out of a storage unit.

2. Description of Related Art

In a semiconductor device production line, with an advanced fine patterning and an elevated integrated density of a semiconductor device, in order to prevent dust from being deposited on a wafer, which is a work, to a possible maximum extent, it is a general practice that just until the wafer is actually processed by a manufacturing apparatus in the production line, a wafer carrier for holding wafers is accommodated in a container box so that the wafer is shielded from the outside air. Further, in order to avoid dusts generated from a human body, the opening and closing of the container box and the conveying of the wafer carrier are automated so that the intervention of a human being is avoided. Reticles for an exposure machine, which must be similarly protected from dust deposition, are storage-controlled similarly to the above case. The following description will be limited to the wafer for simplification of the description.

FIG. 1 is a diagrammatic perspective view for illustrating one example of the prior art automatic storage system and automatic storing method. In the prior art, a method for take-in and Lake-out to a storage unit is such that, for example, as shown in FIG. 1, a wafer carrier 6 for holding wafers which have been processed in a preceding processing step is accommodated in a container box 1 and is kept in a storage unit 8 until a next processing is conducted. In order to perform the next processing, after the container box 1 is carried out from the storage unit 8, the wafer carrier 6 is taken out from the container box 1, and then, conveyed by a carrier car 11 to a next manufacturing apparatus, and transferred to a station of the manufacturing apparatus.

Further, the wafer carrier 6, which has received the wafer processed by the manufacturing apparatus, is conveyed to the storage unit 8 by the carrier car 11, and then, transferred to a station before a take-in port 13 of the storage unit 8. Thereafter, the wafer carrier 6 is accommodated in the container box 1, and then, fed into the storage unit 8, so that it is moved to and kept on a predetermined shelf in the storage unit 8 by a not-shown stacker crane.

In addition, when the wafer carrier which holds the processed wafers and which is kept in the storage unit 8 is to be conveyed into another storage unit for a next process, the container box accommodating the wafer carrier therein is taken out from the storage unit 8 by the stacker crane and moved to a station before a take-out port 14. Thereafter, a cover 3 is removed by an opening/closing mechanism 7, so that the wafer carrier 6 is exposed. Furthermore, the wafer carrier 6 is transferred to a bed of the carrier car 11 by a robot arm of the carrier car 11, and then, is conveyed to the next process.

At the same time as the wafer carrier starts to be conveyed, the opening/closing mechanism 7 operates to put the cover 3 on a table 2 to assemble an empty container box.

The empty container box thus assembled is picked up by a fork of the stacker crane provided within the storage unit 8, and moved from the take-out port 14 into the storage unit 8 and then located on a predetermined shelf.

As mentioned above, the wafer carrier 6 conveyed for a relatively short time is conveyed in an exposed condition, since possibility of deposition dust is small. On the other hand, the wafer carrier 6 staying in the storage unit 8 for a long time is kept in the storage unit 8 in such a condition that the wafer carrier is accommodated in the container box to prevent the dust from being deposited on the wafers.

Recently, however, the semiconductor devices have an inclination toward many-kind small-production 1 as typified by a custom IC (integrated circuit) so that the number of wafers included in one lot decreases. For example, there has appeared the case that only an extremely small number of wafers, for example, one to three wafers, are accommodated in one wafer carrier. Because of this circumstance, the following problems have been encountered in the above mentioned prior art automatic storage system.

A first problem is that: When a small lot of ICs are manufactured, since the number of wafers held in one wafer carrier decreases, the processing time of the manufacturing apparatus per one wafer carrier becomes extremely short. As a result, the number of conveying opportunities of the wafer carrier per a unit time increases, and therefore the, capability of the automatic storage system is reduced. In order to overcome the reduction of the capability of the automatic storage system, it becomes necessary to increase the number of the storage units. However, since the space between the manufacturing devices is limited, it is not possible to increase the number of the storage units.

A second problem is that: Since an operating time is required for the stacker crane to move the empty container box between the take-in port and the shelf and between the take-out port and the shelf, the conveying time within the storage unit becomes long while the conveying time of the wafer carrier is short. As a result, wafer carriers are backed up congest before the storage unit, and the, possibility that dust is deposited on wafers left in the exposed condition, increases with the result that ? significant defect occurs in quality.

A third problem is that because of the above mentioned congestion, the number of wafers for which a necessary processing has not been completed in a given step, increases with the result that the manufacturing capability drops and the lead time is deteriorates. In addition, the rate of operation in the manufacturing apparatus drops, and the production efficiency lowers.

SUMMARY OF THE INVENTION

Accordingly, it is an object of the present invention to provide an automatic storage system and an automatic storing method which have overcome the above mentioned problems of the prior art.

Another object of the present invention is to provide an automatic storage system and an automatic storing method, capable of taking in and taking out container boxes, without increasing the number of storage units and without congestion of carriers for holding works.

The above and other objects of the present invention are achieved in accordance with the present invention by an automatic storage system so configured that a container box for accommodating a box-like carrier which is conveyed by a carrier car and which holds a plurality of plate-like works arranged in one direction, is received for a temporary storage and then the carrier is taken out from the container box and moved to the carrier car, the automatic storage system comprising a storage unit having an inlet/outlet port through which the container box is taken in and out and a plurality of shelves on which the container box is put, a stacker crane traveling within the storage unit to and from the inlet/outlet port and for putting the container box on the shelf and picking up the container box from the shelf, an opening/closing mechanism for opening and closing the container box disposed before the inlet/outlet port, and a control means operating on the basis of a previously set take-in/take-out schedule for container boxes, for taking in and out the container box and for causing an empty container box to stay before the inlet/outlet port.

In addition, the shelf for receiving the empty container box is preferred to be ensured near to the inlet/outlet port within the storage unit. In addition, the works are wafers for semiconductor substrates or reticles for an exposure machine.

According to a second aspect of the present invention, there is provided an automatic storing method for the above mentioned automatic storage system, comprising the steps of causing the carrier conveyed to the inlet/outlet port in accordance with the above mentioned previously set take-in/take-out schedule, to be accommodated into the empty container box previously disposed before the inlet/outlet port, keeping the container box which has accommodated the carrier therein, in the storage unit and thereafter moving another container box kept in the storage unit to the inlet/outlet port, opening the other container box to Take out the carrier in the other container box, and causing the other container box which has become empty, to stay before the inlet/outlet port.

According to a third aspect of the present invention, there is provided an automatic storing method for the above mentioned automatic storage system, comprising the steps of moving the container box kept in the storage unit in accordance with the above mentioned previously set take-in/take-out schedule, to the inlet/outlet port, opening the container box to take out the carrier in the container box, causing the container box which has become empty, to stay before the inlet/outlet port, and causing another carrier conveyed to the inlet/outlet port, to be accommodated into the container box which has become empty, and keeping the container box which has accommodated the other carrier in the storage unit.

The above and other objects, features and advantages of the present invention will be apparent from the following description of preferred embodiments of the invention with reference to the accompanying drawings.

BRIEF DESCRIPTION OF THE DRAWINGS

FIGS. 2A and 2B are a diagrammatic perspective view and a diagrammatic sectional view for illustrating one embodiment of the automatic storage system in accordance with the present invention;

FIGS. 3A and 3B are flow charts for illustrating a take-out operation and a take-in operation of the container box in the automatic storage system shown in FIGS. 2A and 2B;

FIG. 4 is a convey request table, which is a take-in take-out schedule of the container box in the automatic storage system shown in FIGS. 2A and 2B;

DESCRIPTION OF THE PREFERRED EMBODIMENTS

Figure 1:
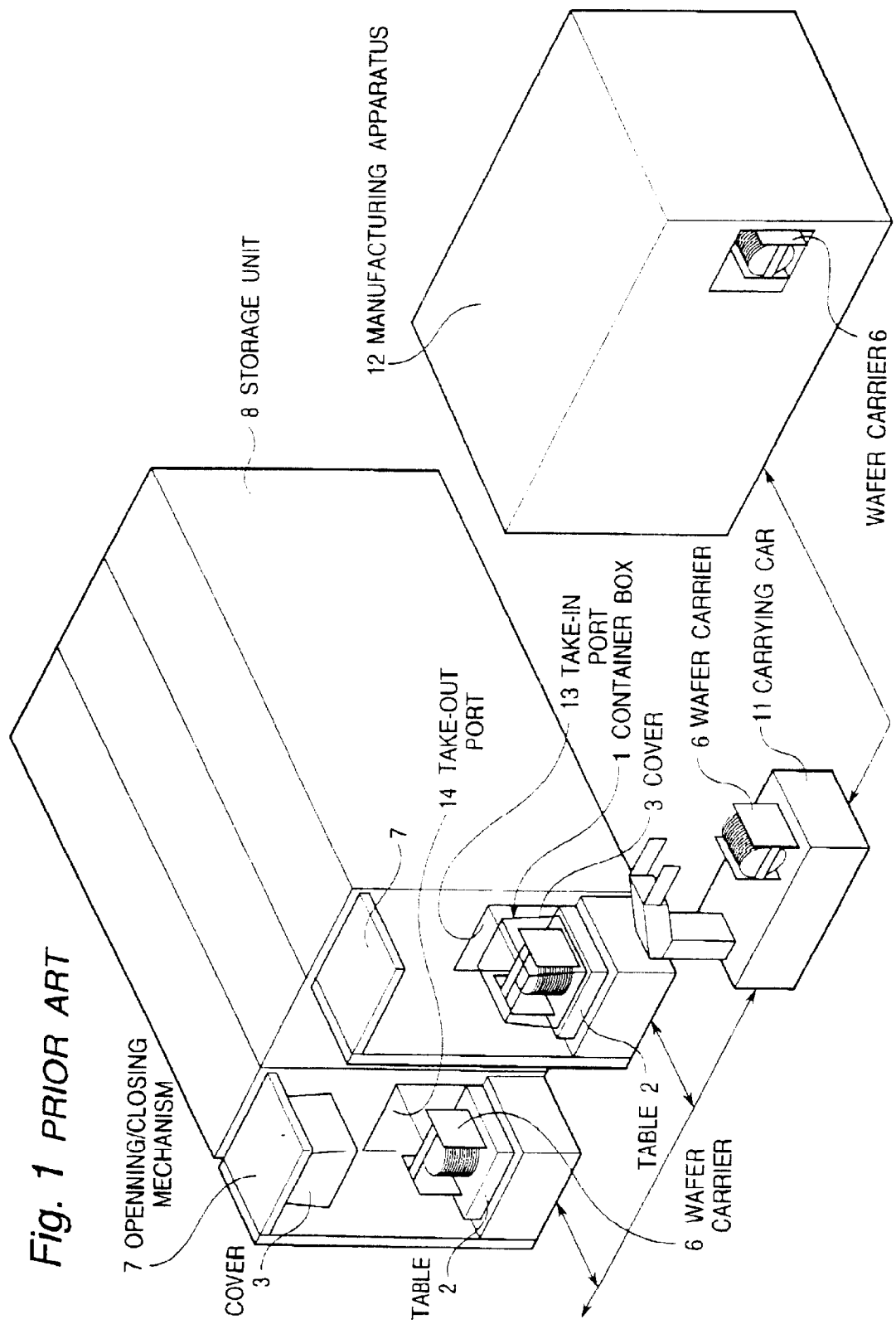
FIG. 1 is a diagrammatic perspective view for illustrating one example of the prior art automatic storage system and automatic storing method.

Now, the present invention will be described with reference to the accompanying drawings.

FIGS. 2A and 2B are a diagrammatic perspective view and a diagrammatic sectional view for illustrating one embodiment of the automatic storage system in accordance with the present invention. As shown in FIGS. 2A and 2B, the automatic storage system comprises an elongated storage unit 8 of a closed structure having a plurality of storage shelves 17 which are located in a vertical direction and in a horizontal direction and which are configured to receive a container box 1 for accommodating a wafer carrier 6, a stage 18 provided at an inlet/outlet port 15 of the storage unit 8 and used in such a manner that the wafer carrier 6 holding processed wafers and conveyed by a carrier car 11 is transferred on a table 2 disposed on the stage 18, a stacker crane 16 traveling forward and backward in a longitudinal direction within the storage unit 8 and having a fork vertically moving for putting the container box 1 on any shelf 17 and for picking up the container box 1 from any shelf 17, an opening/closing mechanism 7 for opening and closing the container box 1 by opening a cover 3 of the container box 1 transferred on the stage 18 or by covering the cover 3 over the wafer carrier 6, and a control unit 20 for controlling an operation of the opening/closing mechanism 7 and the stacker crane 16 on the basis of a previously set take-in/take-out schedule. In order to move the container box 1 from any shelf 17 in the storage unit 8 to the inlet/outlet port 15 so as to take out the wafer carrier 6 from the storage unit 8 or in order to convey the wafer carrier 6 from a manufacturing apparatus to the inlet/outlet port 15 so as to place it on any shelf 17 in the storage unit 8.

In the storage unit 8, at both sides of a central line on which the stacker crane 16 travels, the plurality of shelves 17 are located in a vertical direction and in a horizontal direction. These shelves 17 are grouped into a plurality of groups in accordance with the kind of designated manufacturing apparatuses. Therefore, in order to make a traveling distance of the stacker crane 16 as short as possible, the shelves 17 positioned near to the inlet/outlet port 15 are preferred to be allocated to the manufacturing apparatus having a high designation frequency. In addition to the container box 1 opened and closed by the opening/closing mechanism 7 of the inlet/outlet port 15, a cleaned-up extra container box 1a is preferably kept at the shelf 17 positioned near to the inlet/outlet port 15. Additionally, there is provided a sensor for detecting whether or not the table 2 exists on the stage 18, in order to determine whether or not an empty container box is disposed before the inlet/outlet port 15. Furthermore, whether or not the cover 3 is opened, is determined by a sensor of the opening/closing mechanism 7.

FIGS. 3A and 3B are flow charts for illustrating a take-out operation and a take-in operation of the container box in the automatic storage system shown in FIGS. 2A and 2B. Now, the take-out operation of the container box in the automatic storage system will be described with reference to FIGS. 2A and 2B and FIG. 3a. First, in a step A of FIG. 3A, whether or not an empty container box is present on the stage 18 of the inlet/outlet 15 in FIGS. 2A and 2B is determined. If the empty container box to not present, the operation goes to a step D of FIG. 3A in which, by means of the stacker crane 16 in FIGS. 2A and 2B, the container box 1 is taken out from a predetermined shelf 17 to be moved to the inlet/outlet port 15 and shifted to the stage 18. Thereafter, in a step E, the opening/closing mechanism 7 is operated to open the cover 3, and in a succeeding step F the wafer carrier 6 is transferred from the table 2 to the carrier car 11 by means of an arm of the carrier car 11. If it is determined in the step A of FIG. 3A that the empty container box is present, the operation goes to a step B in which, the cover 3 is covered over the table 2 by action of the opening/closing mechanism 7. In a succeeding step C, by means of the stacker crane 16, an empty container box 1a is moved into the storage unit 8 and is placed on a predetermined shelf 17.

In the take-in operation to the storage unit 8, in a step A of FIG. 3B, whether or not an empty container box is present on the stage 18 of the inlet/outlet 15 in FIGS. 2A and 2B is determined. If it is determined that the empty container box is not present, the operation goes to a step B of FIG. 3A in which, by means of the stacker crane 16, the empty container box 1a is picked up from the predetermined shelf 17 in the storage unit 8 to be moved onto the stage 18 of the inlet/outlet port 15. Then, in a step C, the cover 3 of the empty container box is lifted up by the opening/closing mechanism 7. If it is determined in the step A that the empty container box is present, the operation goes to a step D in which the wafer carrier 8 conveyed before the stage by the carrier car 11 is transferred to the table 2. Then in a step E, the cover 3 is closed, and in a step F, the container box 1 accommodating the wafer carrier 6 is moved to and placed on a predetermined shelf 17 by action of the stacker crane 16.

As mentioned above, one inlet/outlet port is provided in the storage unit, and the empty container box is disposed before the inlet/outlet port without exception after the take-out operation, so that the take-in operation and the take-out operation to the storage unit are separated from each other, with the result that one stacker crane is effectively operated and the efficiency of the take-in/take-out operation is increases.

Figure 5:
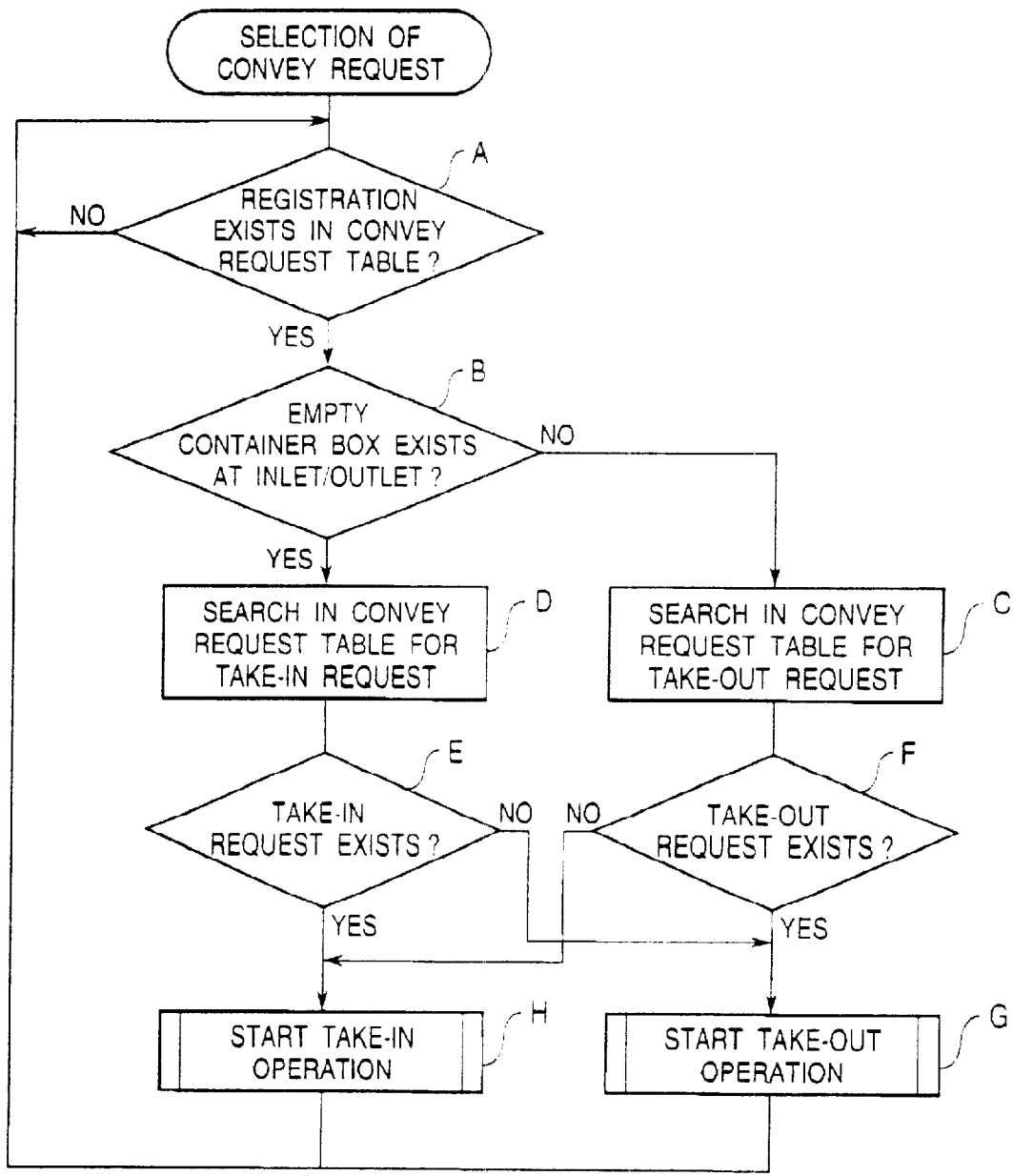
FIG. 5 is a flow chart for illustrating an operation of the automatic storage system shown in FIGS. 2A and 2B, based on the convey request table shown in FIG. 4.

FIG. 4 is a convey request table which is a take-in/take-out schedule of the container box in the automatic storage system shown in FIGS. 2A and 2B. FIG. 5 is a flow chart for illustrating an operation based on the convey request table shown in FIG. 4. The above mentioned take-in/take-out operation is simply based on the precondition that the empty container box is present before the inlet/outlet port 15. Now, an actual take-in/take-out operation will be described with reference to FIGS. 2A and 2B, FIG. 4 and FIG. 5.

First, in a step A of FIG. 5, there is determines whether or not the convey request table of FIG. 4 (which is the take-in/take-out schedule) is registered in a setting memory of the control unit 20. If there is no registration, no operation is conducted, and it waits until a convey request is requested. If the convey request is registered, the operation goes to a step B, in which there is determined whether or not the empty container box is present before the inlet/outlet port 15 of FIGS. 2A and 2B. If the empty container box is present, the operation goes to a step D, in which the convey request table of FIG. 4 is searched to find out a take-in request. Then, whether or not the take-in request exists is checked in a step E. For example, if the take-in request exists as shown in Registration Nos. 3, 4 and 5, the operation goes to a step H in which the take-in request having a small registration number is selected, and the wafer carrier is conveyed to start the take-in operation of the container box as shown in FIG. 3B.

If it is determined in the step E that no take-in request exists in the convey request table of FIG. 4, the operation goes to a step G, in which the operation as shown in the flow chart of FIG. 3A is conducted to take out the container box accommodating the wafer carrier therein. On the other hand, if it is determined in the step B that no empty container box is present before the inlet/outlet port 15, the operation goes to a step C, in which the convey request table of FIG. 4 is searched to determine whether or not the take-out request exists, in a step F. If the take-out request exists as shown in Registration Nos. 1, 2 and 6, the take-out request having a small registration number is selected, and in a step G, the container box is taken out by the operation shown in FIG. 3A. If there is no registration number, the operation goes to the step H in which the take-in operation of the container box as shown in FIG. 3B is conducted.

As mentioned above, whether or not the empty container box is present before the inlet/outlet port 15 is determined, and which of the take-in operation and the take-out operation should be conducted is determined on the basis of the result of the determination, with the result that an unnecessary conveying operation of the empty container box becomes zero, and the conveying efficiency within the storage unit 8 is increased.

Figure 6A:
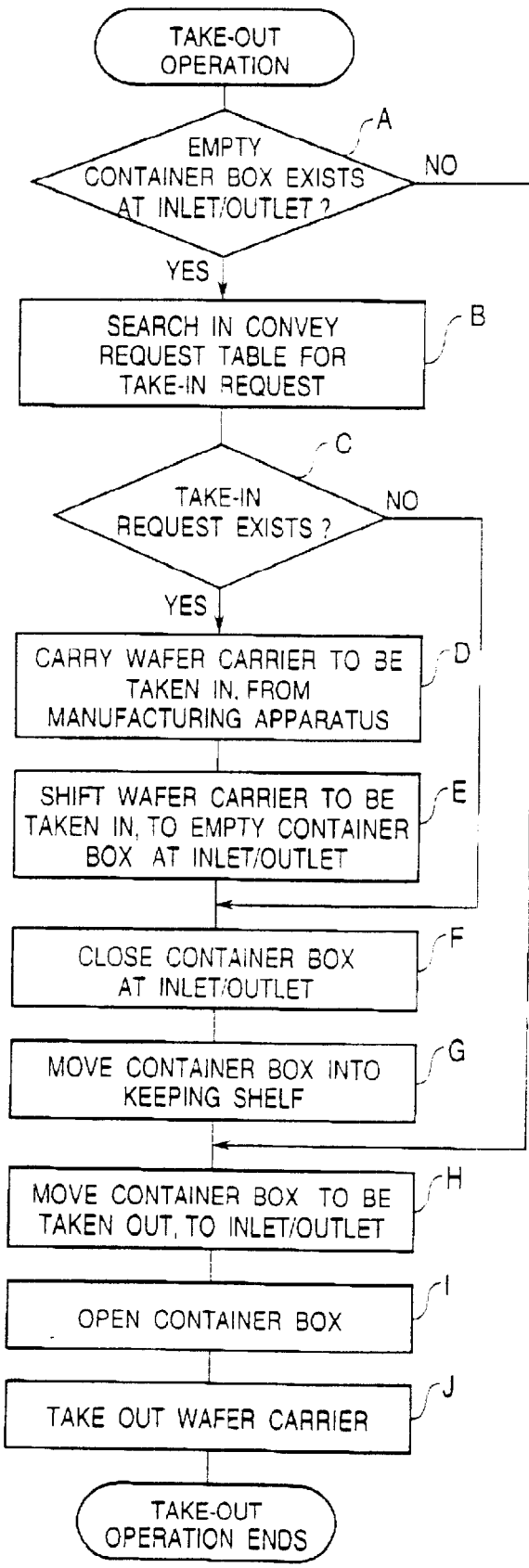
FIGS. 6A and 6B are flow charts for illustrating one embodiment of the automatic storage method, which is a take-in/take-out operation of the wafer carrier in the automatic storage system shown in FIGS. 2A and 2B.
Figure 6B:
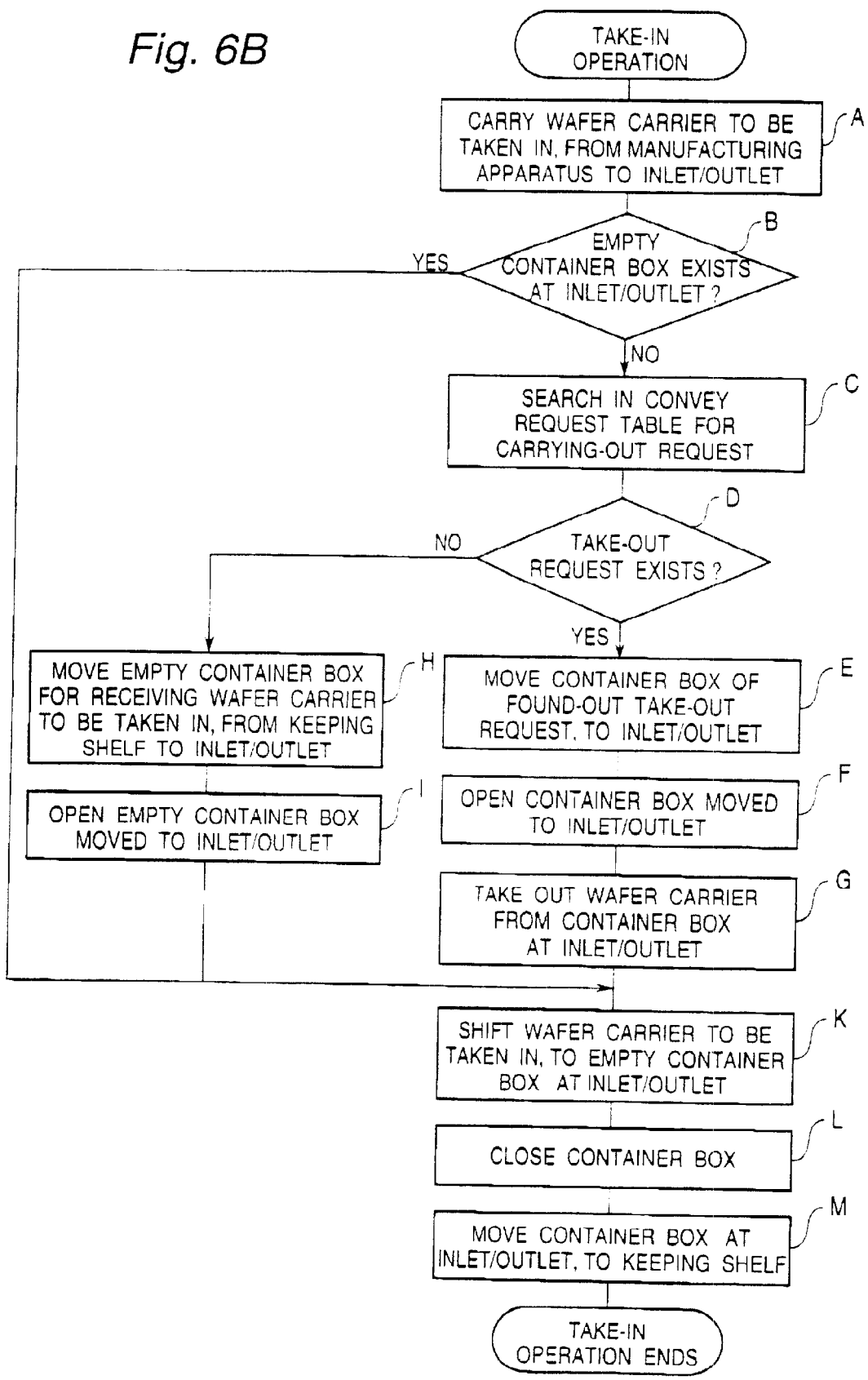

FIGS. 6A and 6B are flow charts for illustrating one embodiment of the automatic storage method, which is a take-in/take-out operation of the wafer carrier in the automatic storage system shown in FIGS. 2A and 2B. The automatic storage method in the take-in/take-out operation is as follows: First, in a step A of FIG. 6A, whether or not the empty container box is present before the inlet/outlet port 15 shown in FIGS. 2A and 2B is determined. If the empty container box is present, the operation goes to a step B, in which the convey request table of FIG. 4 is searched to find out a take-in request. If the take-in request exists in the convey request table, the operation goes into steps D and E, in which the wafer carrier 6 conveyed by the carrier car 1 from the manufacturing apparatus in FIGS. 2A and 2B is transferred to the table 2 of the empty container box. Then, in steps F and G, the cover 3 is covered over the table 2 on which the wafer carrier 6 is put, and by action of the stacker crane 16, the container box 1 is moved into the storage unit and placed on the shelf 17.

If no take-in request is found in the step C, the operation goes to the steps F and G, in which the empty container box is closed, and then, is moved into the storage unit 8 and placed on the shelf 17 by action of the stacker crane 16. After the empty container box or the container box accommodating therein the wafer carrier is placed on the shelf 17, the container box corresponding to the take-out request having a small registration number in FIG. 4 is picked up and conveyed to the inlet/outlet port 15 by means of the stacker crane 16 in a step H. In steps I and J, the cover 3 of the container box 1 located before the inlet/outlet port 15 is opened by the opening/closing mechanism 7, and then, the wafer carrier 6 on the table 2 is transferred to the carrier car 11.

When it is determined in the step A that no empty container box is present before the inlet/outlet port 15, the operation jumps to the step H, in which the container box located on the shelf in the storage unit 8 and having a small registration number is picked up and conveyed to the inlet/outlet port 15 by means of the stacker crane, and then, the cover 3 is opened and the wafer carrier 6 is transferred to the carrier car 11.

As mentioned above, if the take-in request exists in the step C, the take-out operation is temporarily interrupted and the take-in operation is conducted. Thus, after the wafer carrier is accommodated into the empty container box disposed at the inlet/outlet port 15, the container box having accommodated the wafer carrier is received and kept in the storage unit 8, with the result that it is no longer necessary to convey the empty container box into the storage unit 8. On the other hand, when no empty container box is present, an empty container box is left on the inlet/outlet port as the result of the take-out operation. Therefore, it is also no longer necessary to pick up the empty container box from the storage unit 8. Thus, the take-in and take-out operation of the container box can be very smoothly conducted.

Next, another automatic storage method in the take-in/take-out operation will be described with reference to FIGS. 2A and 2B and FIG. 6B. First, in a step A of FIG. 6B, the waver carrier 6 is conveyed by the carrier car 11 to the inlet/outlet port 15 from the manufacturing apparatus 12 in FIGS. 2A and 2B. Then, whether or not the empty container box is present at the stage 18 of the inlet/outlet port 15 is determined in a step B. If no empty container box is present, the convey request table of FIG. 4 is searched in a step C to find the take-out request. If the take-out request is found in a step D, the operation goes to a step E in which the container box corresponding to the registration number of the take-out request is picked up and conveyed to the inlet/outlet port 15 by the stacked crane 16. Then, in steps F and G, the cover 3 of the container box on the stage 18 is opened, and the wafer carrier 6 is transferred to the carrier car 11. Further, in steps K, L and M, another wafer carrier 6 is transferred to the table 2 left before the inlet/outlet port 15, and the cover 3 is closed, and the container box 1 is moved and placed on the shelf in the storage unit 8.

If the empty container box is present in the step B, the operation jumps to the step K, so that the operation is conducted in the order of the steps K, L and M. Namely, the wafer carrier 6 is transferred to the table 2 left before the inlet/outlet port 15, and the cover 3 is closed, and the container box 1 is moved and placed on the shelf in the storage unit 8. In addition, if it is determined in the step D that no take-out request exists in the convey request table of FIG. 4, the operation goes to a step H, in which the empty container box is picked up from the storage unit 8 and conveyed to the inlet/outlet port 15. Then, the cover 3 of the container box is opened in a step I, and thereafter, the operation goes to the steps K, L and M so that the take-in operation is completed.

As mentioned above, just after the wafer carrier is transferred to the carrier car 11 so as to be taken out from the storage unit in the step G, the wafer carrier to be taken in is transferred to the left empty container box. With this arrangement, the moving distance of the carrier car 11 can be shortened, and the conveying of the empty container box becomes zero, similarly to the previously mentioned operation.

Incidentally, this automatic storage system and automatic storing method can be similarly applied to the reticles for the exposure machine. In this case, if a plurality of reticles having patterns to be copied to one lot of wafers are held on a carrier, and if a container box accommodating the carrier is taken in and out, an expected object can be achieved.

As mentioned above, according to the present invention, the take-in port and the take-out port of the storage unit are unified to one common inlet/outlet port, and a control is conducted to the effect that when the container box is taken in and out on the basis of the take-in/take-out schedule of the container box to the storage unit, the empty container box is ceaselessly left at the inlet/outlet port. Therefore, the take-in/take-out operation of the empty container box in the storage unit, which was conducted in the prior art, becomes zero, with the result that the take-in/take-out time of the container box is shortened, and the take-in/take-out efficiency can be increased.

In addition, since the take-in/take-out operation of the container box in the storage unit can be sequentially conducted on the basis of the take-in/take-out schedule by unifying the take-in port and the take-out port of the storage unit to one common inlet/outlet port, so that the traveling of the carrier car can be smoothly controlled with no congestion, deposition of dust on the work caused by the congestion of the carriers becomes zero, and the defect in quality also becomes zero.

Furthermore, since the conveying efficiency within the storage unit is increased the capability of the storage unit is also increased. Therefore, even if the number of conveying opportunities increases because the amount of one lot is reduced, it is no longer necessary to increase the number of storage units, and therefore, it is sufficient if the floorage is small, and the facility cost becomes low.

What is claimed is:

1. An automatic storage system so configured that a container box for accommodating a box-like carrier which is conveyed by a carrier car and which holds a plurality of plate-like works arranged in one direction, is received for a temporary storage and then said carrier is taken out from said container box and moved to said carrier car, the automatic storage system comprising:

a storage unit having an inlet/outlet port through which said container box is taken in and out of said storage unit;

a plurality of shelves disposed in said storage unit and on which said container box is put;

a stacker crane traveling within said storage unit to and from said inlet/outlet port and for putting said container box on one of said plurality of shelves and picking up said container box from said one shelf;

an opening/closing mechanism for opening and closing said container box staying before said inlet/outlet port;

a sensor detecting whether or not a container box is disposed before said inlet/outlet port; and a control means operating said stacker crane on the basis of a previously set take-in/take-out schedule for container boxes and on the basis of information provided by said sensor, for taking in and out said container box and for causing an empty container box to stay before said inlet/outlet port after a take out operation in which said carrier is taken out from said container box and moved to said carrier car, without returning said empty container box to said shelf.

2. An automatic storage system claimed in claim 1 wherein of said plurality of shelves, a shelf for receiving said empty container box is allocated near to said inlet/outlet port within said storage unit.

3. An automatic storage system claimed in claim 2 wherein said works are wafers for semiconductor substrates.

4. An automatic storage system claimed in claim 2 wherein said works are reticles for an exposure machine.

5. An automatic storage system claimed in claim 1 wherein said works are wafers for semiconductor substrates.

6. An automatic storage system claimed in claim 1 wherein said works are reticles for an exposure machine.

7. An automatic storing method for an automatic storage system including a storage unit having a plurality of shelves therein, a plurality of work carriers for holding a plurality of plate-like works, a plurality of container boxes each for accommodating a work carrier, a carrier car for conveying a work carrier, an inlet/outlet port through which a container box is taken into and out of said storage unit, and a stacker crane traveling within said storage unit to and from said inlet/outlet port for putting said plurality of container boxes on said plurality of shelves and picking up said plurality of container boxes from said plurality of shelves, said method comprising the steps of:

setting a take-in/take-out schedule with respect to said plurality of work carriers;

determining that an empty container box is present before said inlet/outlet port;

conveying at least one of said carriers to said inlet/outlet port in accordance with said previously set take-in/take-out schedule;

accommodating said at least one work carrier into said empty container box previously determined to be present before said inlet/outlet port;

storing said container box which has accommodated said work carrier therein, in said storage unit;

moving another container box kept in said storage unit to said inlet/outlet port by said stacker crane;

opening said another container box to take out another one of said carriers stored in said another container box; and causing said another container box which has become empty, to be kept before said inlet/outlet port.

8. An automatic storing method for an automatic storage system including a storage unit having a plurality of shelves therein, a plurality of work carriers for holding a plurality of plate-like works, a plurality of container boxes each for accommodating a work carrier, a carrier car for conveying a work carrier, an inlet/outlet port through which a container box is taken into and out of said storage unit, said method comprising the steps of:

setting a take-in/take-out schedule with respect to said plurality of work carriers;

determining that no empty container box is present before said inlet/outlet port;

moving one of said container boxes previously stored in said storage unit to said inlet/outlet port in accordance with said previously set take-in/take-out schedule;

opening said one container box to take out a stored work carrier contained in said one container box; and keeping said one container box which has become empty before said inlet/outlet port.

* * * * *